United States Patent [19]

Freyman et al.

[11] Patent Number: 4,700,276
[45] Date of Patent: Oct. 13, 1987

[54] ULTRA HIGH DENSITY PAD ARRAY CHIP CARRIER

[75] Inventors: Bruce J. Freyman, N. Lauderdale; Dale Dorinski; John Shurboff, both of Coral Springs, all of Fla.

[73] Assignee: Motorola Inc., Schaumburg, Ill.

[21] Appl. No.: 816,164

[22] Filed: Jan. 3, 1986

[51] Int. Cl.$^4$ .............................................. H05K 7/06
[52] U.S. Cl. .................................. 361/403; 361/400; 361/414
[58] Field of Search ............................. 357/75, 80, 84; 361/400, 403–404, 405.6, 408, 414; 174/52 FP, 68.5

[56] References Cited

U.S. PATENT DOCUMENTS

| | | | |
|---|---|---|---|
| 3,658,618 | 4/1972 | Gramann | 357/75 |
| 3,838,984 | 10/1974 | Crane et al. | 357/80 X |
| 3,868,724 | 2/1975 | Perrino | 357/80 X |
| 4,202,007 | 5/1980 | Dougherty et al. | 357/80 |
| 4,251,852 | 2/1981 | Ecker et al. | 361/386 |
| 4,336,551 | 6/1982 | Fujita et al. | 357/80 |
| 4,381,602 | 5/1983 | McIver | 174/52 FP X |
| 4,413,308 | 11/1983 | Brown | 361/398 |
| 4,437,109 | 3/1984 | Anthony et al. | 174/68.5 X |
| 4,446,477 | 1/1984 | Currie et al. | 357/80 X |
| 4,509,096 | 4/1985 | Baldwin et al. | 361/386 |

FOREIGN PATENT DOCUMENTS

| | | | |
|---|---|---|---|
| 2657313 | 6/1978 | Fed. Rep. of Germany | 361/400 |
| 5230382 | 3/1977 | Japan | 357/80 |

OTHER PUBLICATIONS

Stephans, E., "Pinless Module Connector", IBM Tech. Discl. Bul., vol. 20, No. 10, Mar. 1978, p. 3872.
I.E.E.E. Spectrum, Reed Bowlby, Jun. 1985, pp. 37–42, Describes the Evolution of Integrated Circuit Packages from the Mainstay "DIP" to Newer, More Dense, Chip-Carrier Packages, With and Without Leads.

Primary Examiner—A. T. Grimley
Assistant Examiner—Jane K. Lau
Attorney, Agent, or Firm—Edward M. Roney; Donald B. Southard

[57] ABSTRACT

An ultra high density pad array chip carrier is disclosed which includes a ceramic substrate having a plurality of electrical conductors each of which connect to a respective through-hole plugged with solder on its bottom surface. These solder plugs form a pad array for the chip carrier as well as provide a hermetic seal for the ceramic substrate. A polymer dielectric layer is affixed to the top surface of the ceramic substrate which provides an insulated metal die mount pad thereon. The electrical conductors on the ceramic substrate are formed using well-known vacuum metallization techniques to achieve much narrower widths. Approximately a 40 percent reduction in overall size and cost is achieved utilizing this improved arrangement, which improves reliability and facilitates post-assembly cleaning of the chip carrier when mounted to its final board.

8 Claims, 13 Drawing Figures

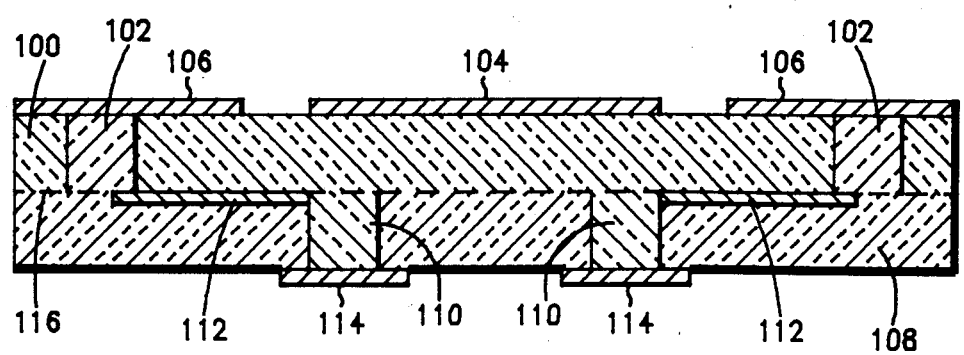
Fig. 1a — PRIOR ART —
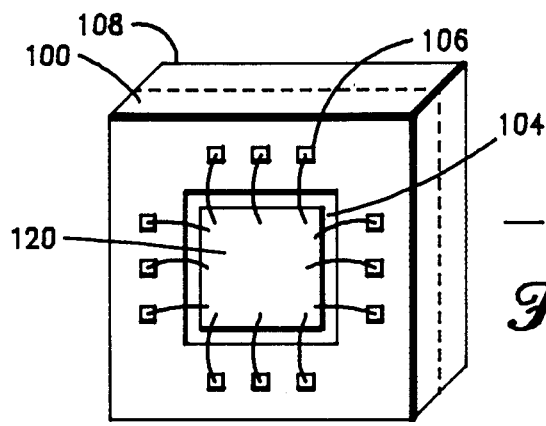
Fig. 1b — PRIOR ART —
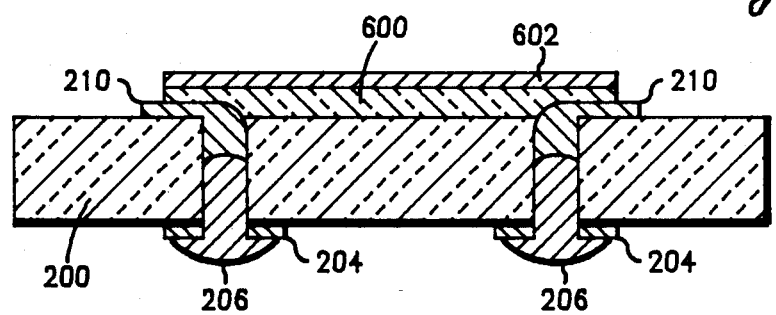
Fig. 6

Fig. 2
— PRIMARY PROCESS —
2a 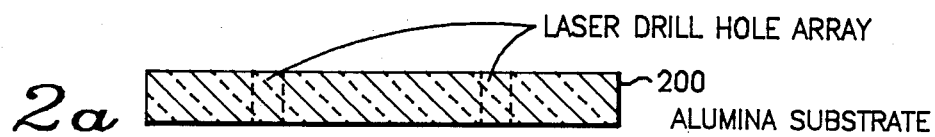
LASER DRILL HOLE ARRAY
200 ALUMINA SUBSTRATE
2b 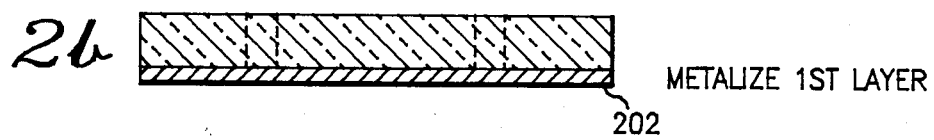
METALIZE 1ST LAYER
202
2c 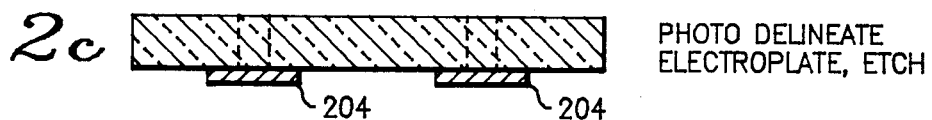
204
PHOTO DELINEATE ELECTROPLATE, ETCH
2d 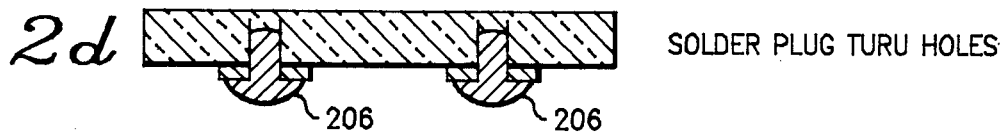
206
SOLDER PLUG THRU HOLES
2e 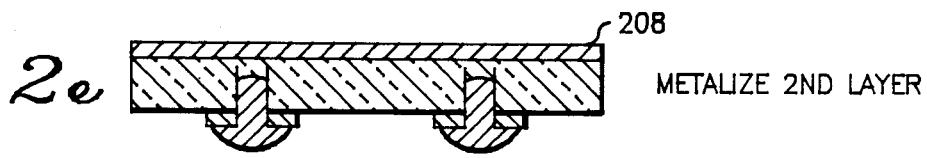
208
METALIZE 2ND LAYER
2f 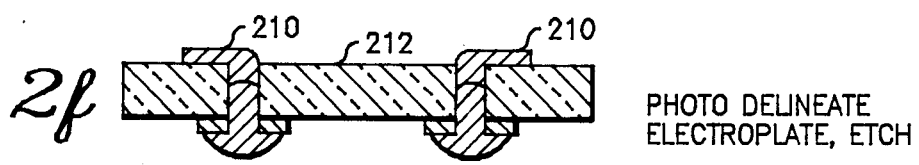
210, 212, 210
PHOTO DELINEATE ELECTROPLATE, ETCH

—SECONDARY PROCESS—

ULTRA HIGH DENSITY PAD ARRAY CHIP CARRIER

BACKGROUND OF THE INVENTION

This invention relates to chip carriers generally and is more particularly concerned with leadless chip carriers.

With the increasing size of large scale integrated circuit chips, the number of input and output connections that have to be made to a chip has correspondingly increased. This trend has encouraged the evolution from dual in-line chip packages, which have two parallel rows of connection pins, to smaller and more dense leadless chip carriers. Leadless chip carriers generally consist of a package containing a square plate of ceramic, such as alumina, which forms a substrate or base onto which a chip is mounted. Electrical connection paths within the leadless chip carrier allow the leads of the chip to be brought to external contact pads formed around each of the four sides of the ceramic base of the carrier. Some leadless chip carriers may even include contact pads formed on the bottom surface of the carrier to utilize the area beneath the chip. The carrier also must provide a thermal conduction path for the enclosed chip and is an important design consideration. The chip carrier is then surface mounted, usually onto a generally larger printed circuit (pc) board or other ceramic board, simply by placing the carrier on top of corresponding contact pads which mirror those contact pads of the chip carrier. An electrical and mechanical connection is then made by soldering the chip carrier to this generally larger board by reflow soldering. This arrangement is less cumbersome than mounting dual in-line packages onto a board and allows greater density of input and output connections to be achieved.

Disadvantages do, however, arise with leadless chip carriers because of the way in which they are connected to a board. Unlike dual in-line packages, where connection is made through relatively flexible pins, the leadless chip carrier is rigidly joined to a generally larger pc board, or other ceramic board, and lacks any ability to accommodate relative movement between the carrier and the board onto which it is mounted. If the chip carrier and the board are of materials having different coefficients of thermal expansion, changes in temperature will cause differential expansion between the two components. This induces strain on the soldered connections, which can cause failure of the electrical and mechanical connection, especially after repeated thermal cycling. In severe cases, such thermal cycling can cause the chip carrier to become detached from the board onto which it is mounted. Studies have been made to determine how to minimize such mounting problems without leading to compromises in other aspects of the design. For example, it is known that small ceramic chip carriers operate more reliably in a thermal cycling environment than larger chip carriers, especially when these are mounted onto a printed circuit board. Therefore, it is clear that if a designer seeks to improve the overall reliability of a mounted ceramic chip carrier package, the designer must attempt to reduce the size of the chip carrier.

One known arrangement for a chip carrier utilizes thick-film techniques to form a pattern of screened-on metallic paste on the surface of an unfired ceramic substrate. Through-holes in this ceramic substrate are filled with a conductive glass-metal paste combination and connect with electrical conductors formed by the pattern of screened-on metallic paste. This ceramic substrate then has a second ceramic layer added beneath it having contact pads on its bottom surface and separated from the conductors and die mount pad on the first ceramic layer. The size and density realizable for such a co-fired chip carrier, while utilizing the center area beneath the die mount pad, is limited by the additive co-fired process itself in that the narrowest conductor width which can be screened is 5 mils, or millinches, with a typical production width being 8 mils wide. Such constraints limit the size and density possible for a chip carrier manufactured using this co-fired method, and they in turn constrain further desired improvements in reliability and in cost.

Various other arrangements have been proposed to improve the reliability while reducing the overall size and manufacturing cost of a chip carrier, but these have not yet proved successful in overcoming each and every other limitation at the same time.

BRIEF SUMMARY OF THE INVENTION

It is an object of the present invention to provide a chip carrier arrangement and method of manufacture that can be used to alleviate the above-mentioned problems.

It is a further object of the present invention to provide a chip carrier arrangement and method of manufacture that also alleviates the above-mentioned problems at a lower cost.

According to one aspect of the present invention, there is provided a chip carrier arrangement for mounting and electrically connecting to an integrated circuit chip, as well as providing a thermal path therethrough, which achieves a 40 percent size and cost reduction by providing a method of fabricating a more-dense package. The chip carrier arrangement as disclosed herein describes a two-part manufacturing process which eliminates the need for a co-fired layer. Beginning with the ceramic substrate or base of the chip carrier arrangement, conductive runners are formed on both major surfaces and interconnected by means of conductive through-holes through the use of conventional, thin-film processes. The through-holes not only provide interconnection paths from one surface to another, but also form the footprint, or pad array, which interconnects the chip carrier to its final mounting board. On top of the ceramic substrate of the disclosed chip carrier, a flexible dielectric layer is affixed which has a metallized top layer for providing a die mount pad to accept an integrated circuit chip. This flexible dielectric layer serves several important functions. First, it insulates the integrated circuit chip or die from electrical conductors formed on the top surface of the ceramic substrate of the chip carrier. Second, it provides a suitable surface with which to adhere metallization. And third, because it can be made very thin, it does not inhibit the thermal path between the mounted integrated circuit chip and the ceramic base of the chip carrier. Thus the present invention allows a smaller, more-dense, chip carrier arrangement or package to be made without the use of expensive co-firing techniques that yield wide electrical conductors as a result of utilizing such additive metallization processes.

An exemplary chip carrier package according to the arrangement and methods of the present invention will now be described while referring to the accompanying drawings and description.

BRIEF DESCRIPTION OF THE DRAWINGS

FIG. 1a, 1b, is a sketch of a chip carrier representative of the known state of the art.

FIG. 2a–2f illustrates a possible process sequence for effecting the embodiment described according to the present invention for processing the ceramic substrate.

FIG. 6 illustrates another embodiment of the present invention utilizing the ceramic substrate prepared according to the primary process of FIG. 2 and to which is added a flexible dielectric layer utilizing a different secondary process to achieve the same structure and result of the present invention.

DETAILED DESCRIPTION

Figure 3:
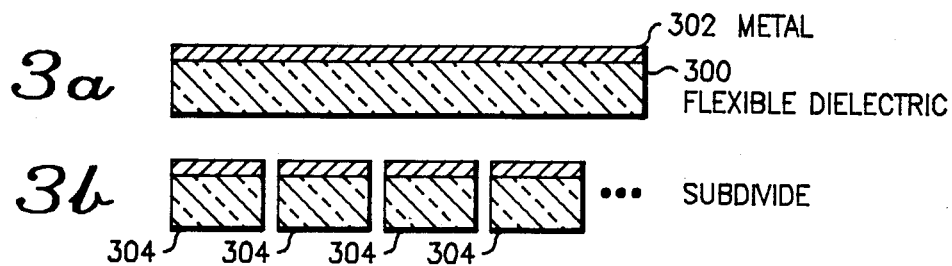
FIG. 3a–3b illustrates a possible process sequence for effecting the embodiment of a flexible dielectric layer by utilizing a secondary process before combining it with the ceramic substrate of the present invention.

Referring now to the drawings, FIG. 1a shows a side view sketch of a chip carrier representative of the known state of the art. FIG. 1b shows a perspective top view of the chip carrier arrangement of FIG. 1a and having a semiconductor chip mounted thereon.

Turning now to the prior art as depicted in FIG. 1a, a first ceramic layer 100, consisting of alumina (or Al$_2$O$_3$), has a number of through-holes 102 which are punched and then filled with conductive glass-metal paste. On one of the major surfaces of ceramic layer 100 are screened metal pads, such as the metal die mount pad 104 and metal wire bond pads 106. The metal wire bond pads 106 are aligned to conductively connect with the through-holes 102. To this first alumina layer 100 is added a second ceramic layer 108 which is typically also made of alumina. This ceramic layer 108 also has through-holes 110 which have been provided and filled with conductive glass-metal paste. In addition, screened, conductors 122 are provided which interconnect the through-holes 102 on the first ceramic layer 100 with the through-holes 110 on the second ceramic layer 108. On the bottom surface of the second ceramic layer 108 metal pads 114 are provided which connect to through-holes 110. This entire arrangement is then fired at a high enough temperature to solidify the glass-metal paste, and fuse the alumina layers provided throughout the assembly. Then, as depicted in the perspective top view of FIG. 1b, this chip carrier arrangement consists of ceramic layer 100 (having a metal die pad 104 and a plurality of metal wire bond pads 106) bonded to ceramic layer 108. As shown in FIG. 1b, this chip carrier arrangement is ready for mounting a semiconductor chip 120, such as an integrated circuit chip. A cover, which ordinarily supplied to provide a sealed package, is not shown in order to clarify how the semiconductor chip mounts and interconnects with the chip carrier arrangement.

The chip carrier arrangement as depicted in FIGS. 1a, 1b is subject to all of the previously enumerated deficiencies set forth with some particularity in the background of the invention. That is, it utilizes expensive co-fired techniques which necessarily limit the minimum possible size of the chip carrier arrangement and which, in turn, affect the reliability as well as the per unit cost.

Figure 4:
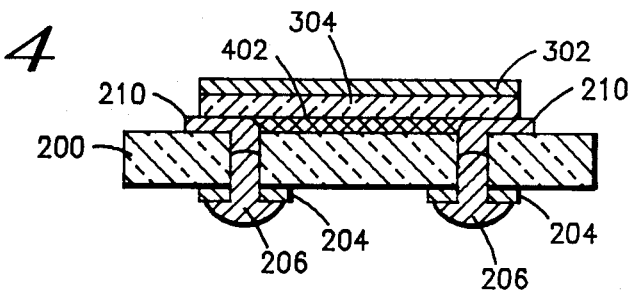
FIG. 4 shows the combination of the ceramic substrate prepared according to the primary process depicted in FIG. 2 and the flexible dielectric layer prepared by the secondary process of FIG. 3 to form the chip carrier arrangement according to the present invention.
Figure 5:
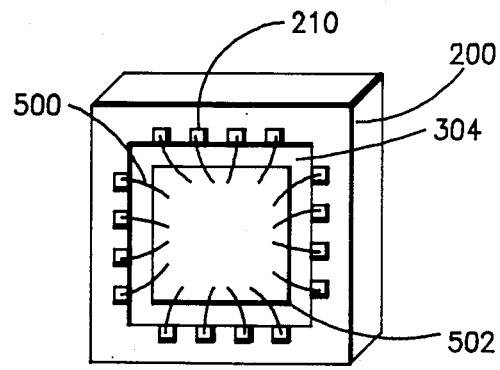
FIG. 5 illustrates a top view of the chip carrier of FIG. 4 with a mounted semiconductor chip connected via bond wires.

Turning now to the preferred embodiment of the improved chip carrier of the present invention (utilizing the processes shown in FIGS. 2 and 3), there results an improved chip carrier arrangement as depicted in FIGS. 4 and 5. In this embodiment, a primary process is shown in FIG. 2 for fabricating a ceramic layer consisting of an alumina substrate 200 drilled to have an array of holes. See step a of FIG. 2. These holes may be of the type formed by known laser-drilling techniques. Proceeding to step b of FIG. 2, a first metallized layer 202 is applied to a surface of the alumina substrate 200 using conventional vacuum metallization techniques. Proceeding to step c of FIG. 2, this metallized surface as well as the through-holes is then photodelineated, electroplated with copper, nickel, and gold, and then etched to form individual conductors 204 which remain electrically connected to a respective conductive through-hole. Then in step d of FIG. 2, the through holes in the alumina substrate 200 are solder-plugged. This step forms solder plugs 206 which will later serve to provide a hermetic seal as well as the surface mount interconnection points for the final chip carrier arrangement. After a cleaning operation, proceeding to step e of FIG. 2, a second metallized layer 208 is added to the alumina substate 200. In step f of FIG. 2, this second metallized layer 208 is similarly photodelineated, electroplated, and etched to form individual conductors 210 which interconnect with solder plugs 206 in the through-holes.

According to the preferred embodiment of the present invention, the secondary process for fabricating a flexible dielectric layer is shown in FIG. 3. Step a of FIG. 3 begins with a flexible dielectric film 300 made of a polymer such as a polyimide film, and known as Kapton, a registered trademark of Dupont. This flexible dielectric film 300 also has a metallized layer 302. Then, proceeding to step b of FIG. 3, this flexible dielectric film 300 processed generally as a large sheet, is next subdivided into the required square slips 304, as shown. Referring now to FIG. 4, a metallized flexible dielectric polyimide film slip 304, fabricated according to the process of FIG. 3, is attached to the alumina substrate 200 previously fabricated according to the process of FIG. 2. The flexible dielectric slip 304 is held in place by means of adhesive 402, which may be an acrylic adhesive. The metallized top layer 302 of flexible dielectric slip 304 is ready to have a semiconductor chip affixed. Referring to FIG. 5, a top perspective view of the chip carrier arrangement disclosed in FIG. 4 shows that bond wires 500 are utilized for interconnecting to a semiconductor chip 502 after it is mounted on metallized dielectric slip 304.

As a result, the preferred embodiment of the present invention provides a chip carrier arrangement having improved reliability directly attributable to a 40 percent size reduction. Moreover, the cost has been reduced by approximately 40 percent, when compared to previously known chip carrier arrangements fabricated using high temperature, co-fired, techniques. These improvements were not previously possible because chip carriers fabricated using high temperature, co-fired techniques could only achieve conductor widths in the range of 5 to 8 mils, whereas the chip carrier arrangement according to the present invention is capable of achieving line widths less than 5 mils. Thus the greater precision needed to implement an ultra high density chip carrier is made possible using electroplated, laser-drilled holes plugged with solder which overcome the limitations due to inaccuracies associated with high temperature co-fired fabrication techniques. Moreover, these vacuum metallization techniques are used to good advantage at every step to implement narrower conductors which outwardly extend just enough to clear the dielectric layer to be affixed on the surface of the ceramic substrate base: first, depositing metal using known vacuum metallization techniques; next, photodelineating the footprint or conductor pattern; then, electroplating copper, nickel, and gold onto the desired pattern and including the laser-drilled through-holes; and finally, etching away the undesired metal to complete the process. The metallized dielectric film also possesses stable material properties which allow it to be advantageously utilized as the dielectric layer. Even in thin sheet form, it provides a material capable of being affixed to ceramic on one surface, and to a metallized layer on its other surface, while still maintaining reasonable dielectric properties.

Referring now to FIG. 6, an alternate embodiment of the present invention is shown having a solution coated flexible dielectric film 600 having a metallized top layer 602 which is affixed to the ceramic alumina substrate 200 fabricated according to the primary process steps of FIG. 2, but in which the film 600 is applied directly without the use of an adhesive. Both the chip carrier arrangement depicted in FIG. 6 and that depicted in FIG. 4 exhibit good adhesion properties which are attributable to the smooth upper surface of ceramic alumina substrate 200 which is notably not riddled with solder bumps. Another benefit attributable to the structure of FIG. 6 (as well as FIG. 4) is that the ceramic alumina substrate 200 sits higher above the board onto which it is mounted due to the additional height of solder plugs 206 not found as part of the known prior art structure depicted in FIG. 1a. Thus, the present invention not only achieves a smaller, more dense chip carrier arrangement, but also maintains or improves the reliability of the electrical connections made when surface mounting the chip carrier to a board.

In summary, the ultra high density chip carrier arrangement permits the construction of an improved, yet smaller and simplified, chip carrier without the need for expensive, high temperature, co-fired techniques.

In addition, this chip carrier arrangement not only eliminates expensive assembly techniques, but also advantageously utilizes several of the material properties of the flexible dielectric layer in conjunction with known thin-film technques to achieve a smaller, more dense chip carrier, thus overcoming the limitations of the known prior art.

Although the chip carrier arrangement of the present invention fully discloses many of the attendant advantages, it is understood that various changes and modifications are apparent to those skilled in the art. Therefore, even though the form of the above-described invention is merely a preferred or exemplary embodiment, variations may be made in the form, construction, and arrangement of the parts without departing from the scope of the above invention.

We claim:

1. An improved chip carrier arrangement for mounting a semiconductor chip and accommodating a protective cover, the chip carrier comprising in combination:
   single, prefired ceramic substrate means forming a base to which a cover attaches and which has an array of conductive through-holes, each through-hole surrounded by conductors on both top and bottom major surfaces and plugged by solder plugs substantially therethrough other than on the top surface, so as to electrically connect, via a plurality of conductive runners that outwardly extend on the top surface, to an arrangement of pads near the periphery of the top surface thereof; and
   single, flexible dielectric layer means placed as a solid sheet on and affixed to said single, pre-fired ceramic substrate means within the arrangement of pads, for covering said array of through-holes plugged by solder plugs substantially therethrough other than on the top surface as well as a portion of said plurality of conductive runners, and having a top surface for affixing a semiconductor chip.
   said single, flexible dielectric layer means providing electrically insulative mounting of a semiconductor chip to allow utilization of the area thereunder for said plurality of conductive runners, and said solder plugged through-holes forming a pad array interface on the bottom surface of said single, pre-fired ceramic substrate means as well as providing a hermetic seal for each through-hole therein, whereby the chip carrier arrangement exhibits significantly greater pad array density.

2. The improved chip carrier arrangement according to claim 1, wherein said single, pre-fired ceramic substrate means comprises a material such as alumina.

3. The improved chip carrier arrangement according to claim 1, wherein said single flexible dielectric layer means comprises a polyimide film.

4. The improved chip carrier arrangement according to claim 1, wherein said single flexible dielectric layer means is affixed to said single pre-fired ceramic substrate means using a material such as an adhesive.

5. The improved chip carrier arrangement according to claim 1, wherein said single flexible dielectric layer means is directly affixed to said single pre-fired ceramic substrate means.

6. The improved chip carrier arrangement according to claim 1, wherein said solder plugs, formed within the through-holes on the bottom surface of said single pre-fired ceramic substrate means, serve to elevate the chip carrier arrangement above a board onto which it is mounted, for providing a gap between the chip carrier arrangement and the board which facilitates final assembly and cleaning operations.

7. The improved chip carrier arrangement according to claim 1, wherein said single flexible dielectric layer means provides a good thermal path from the semiconductor chip mounted thereon to said single pre-fired ceramic substrate means.

8. The improved chip carrier arrangement according to claim 1, wherein said single flexible dielectric layer means includes a metallized top surface for affixing a semiconductor chip.

* * * * *